United States Patent
Kim et al.

(10) Patent No.: US 10,044,359 B1
(45) Date of Patent: Aug. 7, 2018

(54) INJECTION LOCKED PHASE LOCKED LOOP

(71) Applicants: SK hynix Inc., Icheon (KR); Seoul National University R&DB FOUNDATION, Seoul (KR)

(72) Inventors: Sungwoo Kim, Daegu (KR); Han-Gon Ko, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 15/701,333

(22) Filed: Sep. 11, 2017

(30) Foreign Application Priority Data

Feb. 3, 2017 (KR) .................. 10-2017-0015329

(51) Int. Cl.
*H03L 7/099* (2006.01)
*H03L 7/091* (2006.01)
*H03L 7/18* (2006.01)

(52) U.S. Cl.
CPC .............. *H03L 7/099* (2013.01); *H03L 7/091* (2013.01); *H03L 7/18* (2013.01)

(58) Field of Classification Search
CPC ......... H03L 7/08; H03L 7/0896; H03L 7/091; H03L 7/099; H03L 7/0991; H03L 7/18
USPC .................................. 327/147, 150, 156, 159
See application file for complete search history.

(56) References Cited

U.S. PATENT DOCUMENTS

| | | | |
|---|---|---|---|
| 3,882,424 A * | 5/1975 | Debois | H03C 3/09 332/127 |
| 8,841,948 B1 | 9/2014 | Chien et al. | |
| 9,455,667 B2 | 9/2016 | Vlachogiannakis et al. | |
| 2002/0113660 A1* | 8/2002 | Dally | H03K 3/0315 331/135 |
| 2005/0104666 A1* | 5/2005 | Rebel | H03L 7/07 331/2 |
| 2015/0213873 A1* | 7/2015 | Joo | H03L 7/087 365/154 |
| 2016/0182068 A1* | 6/2016 | Sim | H03L 7/083 327/107 |

OTHER PUBLICATIONS

Yongsun Lee et al., "A PVT-Robust-59-dBc Reference Spur and 450-fs$_{RMS}$ Jitter Injection-Locked Clock Multiplier Using a Voltage-Domain Period-Calibrating Loop", 2016 Symposium on VLSI Circuits Digest of Technical Papers, 2016, pp. 1-2, IEEE.

(Continued)

*Primary Examiner* — William Hernandez

(57) ABSTRACT

An injection locked phase locked loop includes an injection locked oscillator configured to generate an oscillation signal according to an injection signal and to generate a replica signal by replicating the oscillation signal when the injection signal is deactivated; a phase controller configured to generate a phase control signal according to a phase error signal; and an error detector configured to generate the phase error signal by comparing a phase of the oscillation signal and a phase of the replica signal, and to control a phase difference between the oscillation signal and the replica signal according to the phase control signal.

20 Claims, 10 Drawing Sheets

(56) References Cited

OTHER PUBLICATIONS

Ahmed Elkholy et al., "A 6.75-to-8.25GHz 2.25mW 190fs$_{rms}$ Integrated—Jitter PVT-Insensitive Injection-Locked Clock Multiplier Using All-Digital Continuous Frequency-Tracking Loop in 65nm CMOS", International Solid-State Circuits Conference Digest Techical Papers, Feb. 24, 2015, pp. 188-189, IEEE.

Seojin Choi et al., "A 185fs$_{rms}$-Integrated-Jitter and-245dB FOM PVT-Robust Ring-VCO-Based Injection-Locked Clock Multiplier with a Continuous Frequency-Tracking Loop Using a Replica-Delay Cell and a Dual-Edge Phase Detector", International Solid-State Circuits Conference Digest Technical Papers, Feb. 2, 2016, pp. 194-195, IEEE.

Jun-Chau Chien et al., "A Pulse-Position-Modulation Phase-Noise-Reduction Technique for a 2-to-16GHz Injection-Locked Ring Oscillator in 20nm CMOS", International Solid-State Circuits Conference Digest Technical Papers, Feb. 10, 2014, pp. 52-53, IEEE.

\* cited by examiner

_US 10,044,359 B1_

INJECTION LOCKED PHASE LOCKED LOOP

CROSS-REFERENCE TO RELATED APPLICATION

The present application claims priority to Korean Patent Application No. 10-2017-0015329, filed on Feb. 3, 2017, which is incorporated herein by reference in its entirety.

BACKGROUND

1. Field

Embodiments of the present disclosure relate to an injection locked phase locked loop with enhanced spurious signal reduction capability.

2. Description of the Related Art

An injection locked oscillator eliminates jitter in the edge of a clock signal when an injection signal is applied, which addresses issues due to jitter accumulation.

However, when the injection locked oscillator is used alone, a spurious signal, which may be referred to as a spur, may occur due to a reference frequency of the injection signal.

For example, a free-running frequency of the injection locked oscillator can be changed due to process-voltage-temperature (PVT) variations. At this time, a difference between the free-running frequency of the injection locked oscillator and the reference frequency of the injection signal may occur, thereby increasing a spur component.

This issue may be addressed by adjusting the free-running frequency to a multiple of the reference frequency using an injection locked phase locked loop. This adjustment may maintain the spur component at a relatively low level. However, further reducing the spur component may be desirable.

SUMMARY

Various embodiments are directed to an injection locked phase locked loop with enhanced spur reduction capability.

In an embodiment, an injection locked phase locked loop may include an injection locked oscillator configured to generate an oscillation signal according to an injection signal and to generate a replica signal by replicating the oscillation signal when the injection signal is deactivated; a phase controller configured to generate a phase control signal according to a phase error signal; and an error detector configured to generate the phase error signal by comparing a phase of the oscillation signal and a phase of the replica signal, and to control a phase difference between the oscillation signal and the replica signal according to the phase control signal.

DETAILED DESCRIPTION

Hereafter, various embodiments will be described below in more detail with reference to the accompanying drawings.

Figure 1:
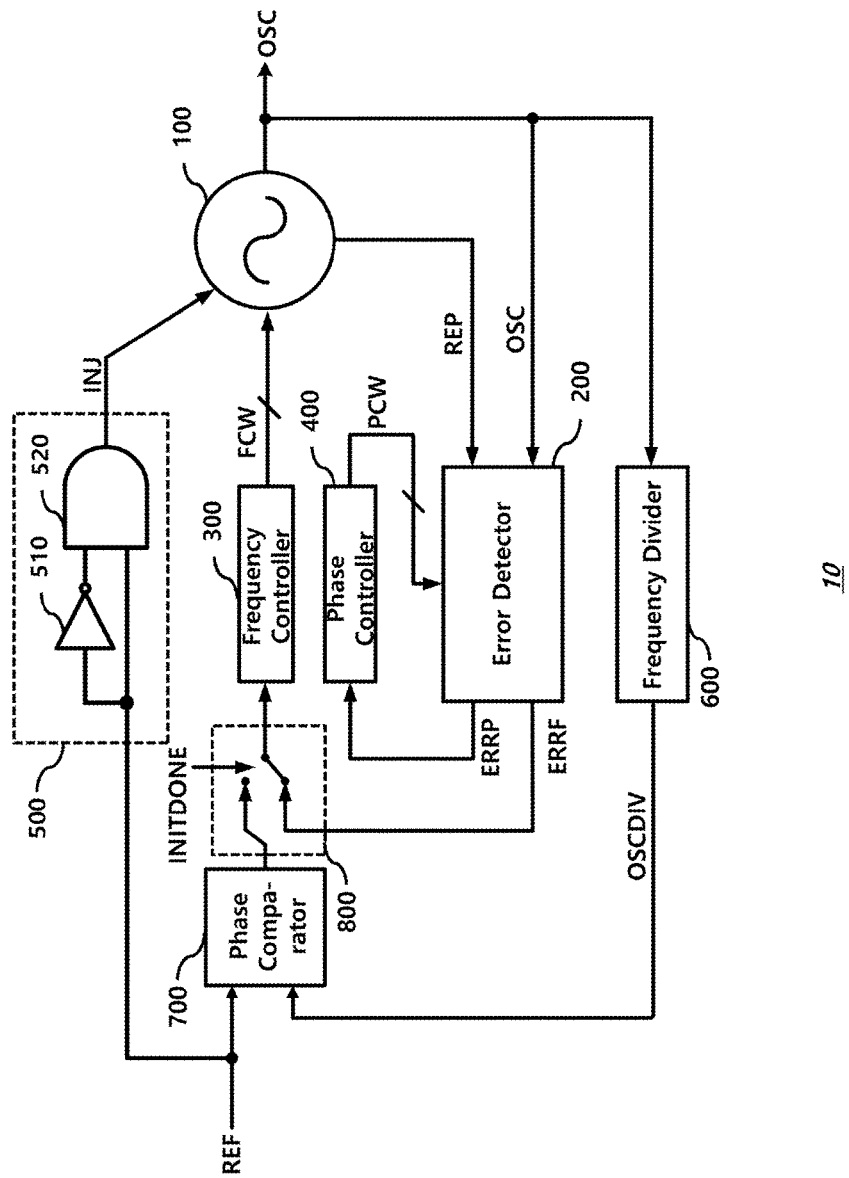
FIG. 1 illustrates an injection locked phase locked loop according to an embodiment of the present disclosure.

FIG. 1 is a block diagram of an injection locked phase locked loop 10 according to an embodiment of the present disclosure.

In the embodiment of FIG. 1, the injection locked phase locked loop includes an injection locked oscillator 100, an error detector 200, a frequency controller 300, a phase controller 400, and an injection signal generator 500.

In the embodiment of FIG. 1, the injection locked phase locked loop 10 may further include a frequency divider 600, a phase comparator 700, and a path selector 800.

The injection signal generator 500 outputs a pulse injection signal (or an injection signal) INJ synchronized with an edge (e.g., a rising edge) of a reference clock signal REF.

The injection signal generator 500 includes an inversion delay circuit 510 for inverting and delaying the reference clock signal REF and a logic gate (e.g., an AND gate) 520 for performing a logical AND operation on an output signal of the inversion delay circuit 510 and the reference clock signal REF.

The injection locked oscillator 100 receives the injection signal INJ and generates an oscillation signal OSC.

The oscillation signal OSC has a frequency corresponding to a multiple of a frequency of the reference clock signal REF after an initial phase locking operation is performed.

In the embodiment of FIG. 1, the injection locked oscillator 100 further generates a replica signal REP, which replicates the oscillation signal OSC when the injection signal INJ is deactivated. The injection signal INJ is deactivated when it has a specific logic value (e.g., a logic low value).

The frequency divider 600 divides the frequency of the oscillation signal OSC by a frequency division ratio N, which is a natural number, and generates a divided signal OSCDIV.

Accordingly, a period of the divided signal OSCDIV output from the frequency divider 600 is N times as long as a period of the oscillation signal OSC.

The phase comparator 700 compares a phase of the reference clock signal REF with a phase of the divided signal OSCDIV output from the frequency divider 600 and outputs a signal indicating the comparison result.

The path selector 800 selects the signal output from the phase comparator 700, or a frequency error signal ERRF output from the error detector 200, according to whether the initial phase locking operation has been completed, and provides the selected signal to the frequency controller 300. For example, the path selector 800 may select the signal output from the phase comparator 700 before the initial phase locking operation has been completed, and may select the frequency error signal ERRF after the initial phase locking operation has been completed.

The initialization completion signal INITDONE indicates whether or not the initial phase locking operation has been completed.

When the initialization completion signal INITDONE is deactivated and has a first logic value (e.g., a logic low value), the initialization completion signal INITDONE indicates that the initial phase locking operation has not been completed. When the initialization completion signal INITDONE has the first logic value, the path selector 800 provides the signal output from the phase comparator 700 to the frequency controller 300, thereby performing the initial phase locking operation to control the frequency of the oscillation signal OSC output from the injection locked oscillator 100. For example, the initial phase locking operation can be regarded as a phase locking operation in a general phase locked loop.

When the initial phase locking operation has been completed, the frequency of the oscillation signal OSC output from the injection locked oscillator 100 is substantially fixed to a product equal to N times the frequency of the reference clock signal REF.

When the initial phase locking operation has been completed, the initialization completion signal INITDONE is activated to have a second logic value (e.g., a logic high value). When the initialization completion signal INITDONE is activated, the injection locked phase locked loop 10, according to an embodiment of the present disclosure, may use an error detector 200 and a frequency controller 300, instead of the phase comparator 700, to control the frequency of the oscillation signal OSC of the injection locked oscillator 100.

In addition, the injection locked phase locked loop 10 according to an embodiment of the present disclosure compensates for a path mismatch to the error detector 200 using the phase controller 400 and the error detector 200. For example, the path mismatch includes a device mismatch between oscillation circuits in the injection locked oscillator 100 as well as a routing path mismatch between the oscillation signal OSC and the replica signal REP.

The error detector 200 generates the frequency error signal ERRF by comparing a phase of the replica signal REP and a phase of the oscillation signal OSC when the injection signal INJ is activated. The injection signal INJ is activated when it has a first logic value (e.g., a logic high value). The error detector 200 also generates a phase error signal ERRP by comparing the phase of the replica signal REP and the phase of the oscillation signal OSC, when the injection signal INJ is deactivated. The injection signal INJ is deactivated when it has a second logic value (e.g., a logic low value).

The frequency controller 300 generates a frequency control signal FCW in response to the frequency error signal ERRF. The frequency controller 300 provides the frequency control signal FCW to the injection locked oscillator 100 to control the frequency of the oscillation signal OSC.

The phase controller 400 generates a phase control signal PCW in response to the phase error signal ERRP. The phase control signal PCW controls a mismatch existing in the propagation path between the oscillation signal OSC and the replica signal REP within the error detector 200.

Figure 2:
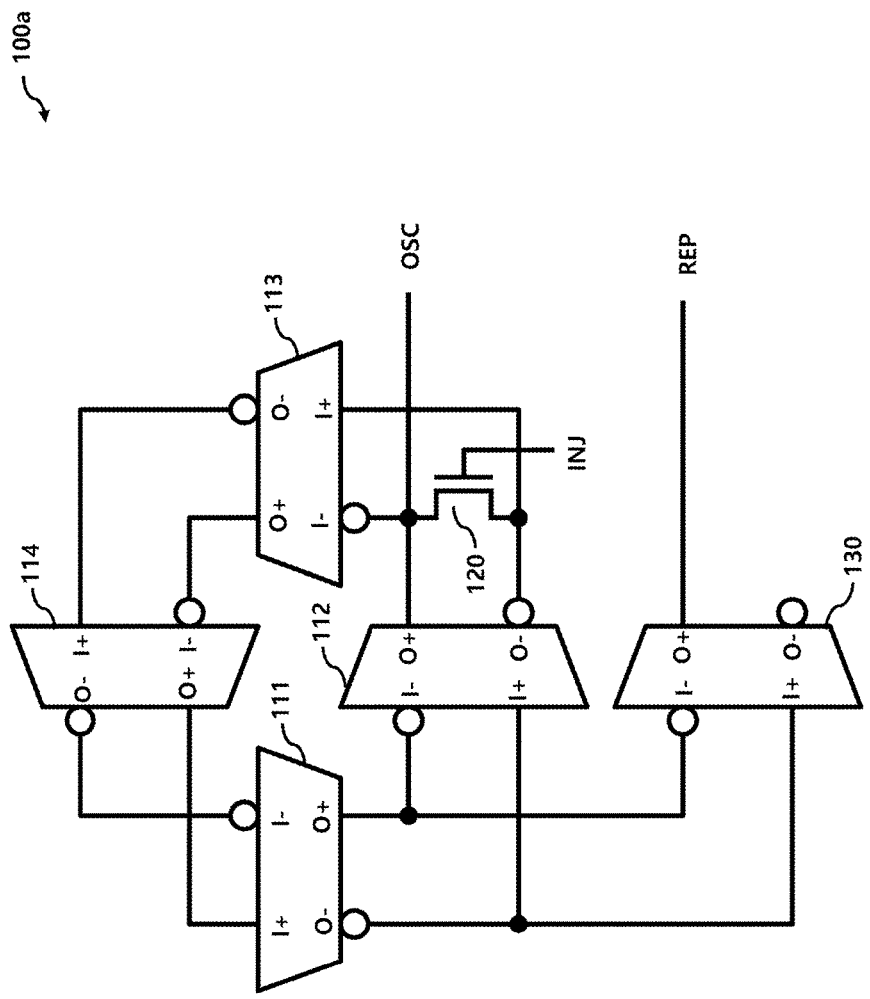
FIG. 2 is a circuit diagram of an injection locked oscillator according to an embodiment of the present disclosure.

FIG. 2 is a circuit diagram of an injection locked oscillator 100*a* according to an embodiment of the present disclosure. The injection locked oscillator 100*a* of FIG. 2 may be used as the injection locked oscillator 100 of FIG. 1.

In the embodiment of FIG. 2, the injection locked oscillator 100*a* has a first oscillation circuit 111, a second oscillation circuit 112, a third oscillation circuit 113, and a fourth oscillation circuit 114, which are connected in a ring shape.

In an embodiment, the first to fourth oscillation circuits 111 to 114 have substantially the same configuration.

Each of the first to fourth oscillation circuits 111 to 114 has first and second differential input terminals I+ and I− and first and second differential output terminals O+ and O−.

The first output terminal O+ of a front oscillation circuit is connected to the second input terminal I− of a rear oscillation circuit, and the second output terminal O− of the front oscillation circuit is connected to the first input terminal I+ of the rear oscillation circuit. For example, the first output terminal O+ of the first oscillation circuit 111 is connected to the second input terminal I− of the second oscillation circuit 112, and the second output terminal O− of the first oscillation circuit 111 is connected to the first input terminal I+ of the second oscillation circuit 112. In addition, the first output terminal O+ of the second oscillation circuit 112 is connected to the second input terminal I− of the third oscillation circuit 113, and the second output terminal O− of the second oscillation circuit 112 is connected to the first input terminal I+ of the third oscillation circuit 113.

The first output terminal O+ of the fourth oscillation circuit 114 is connected to the first input terminal I+ of the first oscillation circuit 111, and the second output terminal O− of the fourth oscillation circuit 114 is connected to the second input terminal I− of the first oscillation circuit 111.

The injection locked oscillator 100*a* includes an injection signal input circuit 120, which receives an injection signal INJ.

In an embodiment, the injection signal input circuit 120 includes an n-channel metal-oxide semiconductor (NMOS) transistor having a source and a drain respectively connected to the second and first output terminals O− and O+ of the second oscillation circuit 112. A gate of the NMOS transistor receives the injection signal INJ. In this embodiment, the oscillation signal OSC is output at the first output terminal O+ of the second oscillation circuit 112.

The injection locked oscillator 100*a* includes a replica circuit 130 replicating the oscillation signal OSC. The replicated oscillation signal OSC may be output by the replica circuit 130 as a replica signal REP when the injection signal INJ is deactivated. The injection signal INJ is deactivated when it has a specific logic value (e.g., a logic low value).

In an embodiment, the replica circuit 130 has substantially the same configuration as that of the second oscillation circuit 112, and receives output signals of the first oscillation circuit 111. That is, the first output O+ of the first oscillating circuit 111 is connected to the second input I− of the replica circuit 130, and the second output O− of the first oscillating circuit 111 is connected to the first input I+ of the replica circuit 130. In this embodiment, the replica signal REP is output at the first output O+ of the replica circuit 130.

Accordingly, the replica circuit 130 generates the replica signal REP by replicating the oscillation signal OSC when the injection signal INJ is deactivated.

Figure 3:
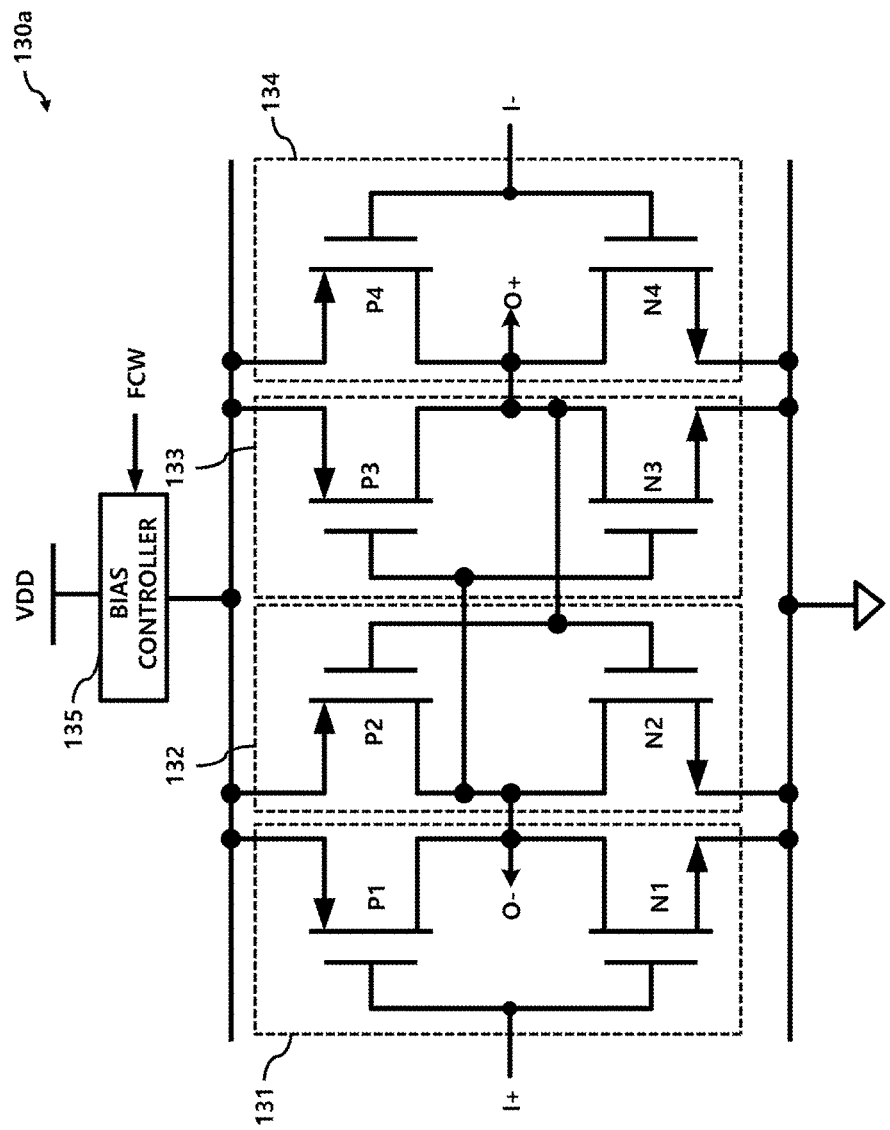
FIG. 3 illustrates a replica circuit according to an embodiment of the present disclosure.

FIG. 3 illustrates a replica circuit 130*a* according to an embodiment of the present disclosure. The replica circuit 130*a* of FIG. 3 may be used as the replica circuit 130 of FIG. 2.

In an embodiment, the first to fourth oscillation circuits 111 to 114 in FIG. 2 have substantially the same circuit as the replica circuit 130*a*.

The replica circuit 130a in FIG. 3 includes first, second, third, and fourth inverters 131, 132, 133, and 134.

The first inverter 131 has an input terminal connected to a first input terminal I+, and an output terminal connected to a second output terminal O−.

The fourth inverter 134 has an input terminal connected to a second input terminal I−, and an output terminal connected to a first output terminal O+.

The second inverter 132 has an input terminal connected to the first output terminal O+, and an output terminal connected to the second output terminal O−.

The third inverter 133 has an input terminal connected to the second output terminal O−, and an output terminal connected to the first output terminal O+.

The first inverter 131 includes a first p-channel metal-oxide semiconductor (PMOS) transistor P1 and a first NMOS transistor N1, which have respective drains connected to the second output terminal O− in common.

The second inverter 132 includes a second PMOS transistor P2 and a second NMOS transistor N2, which have respective drains connected to the second output terminal O− in common.

The third inverter 133 includes a third PMOS transistor P3 and a third NMOS transistor N3, which have respective drains connected to the first output terminal O+ in common.

The fourth inverter 134 includes a fourth PMOS transistor P4 and a first NMOS transistor N4, which have respective drains connected to the first output terminal O+ in common.

In the embodiment of FIG. 3, each of the sources of the first to fourth NMOS transistors N1 to N4 is grounded, and each of the sources of the first to fourth PMOS transistors P1 to P4 is connected to the bias controller 135.

The bias controller 135 adjusts a magnitude of a bias current flowing from the power supply VDD to the first to fourth PMOS transistors P1 to P4 according to a frequency control signal FCW (e.g., the frequency control signal FCW of FIG. 1).

In an embodiment, the frequency control signal FCW is a multi-bit digital signal, and the bias controller 135 may include a plurality of MOS transistors. The plurality of MOS transistors may be connected in parallel to each other, and each of the plurality of MOS transistors has a gate receiving a signal indicative of a corresponding bit value of the frequency control signal FCW.

The bias controller 135 adjusts the magnitude of the bias current according to the frequency control signal FCW to control an amount of delay from the input terminals I+ and I− to the output terminals O+ and O−. As a result, the bias controller 135 may control the oscillation signal OSC and the replica signal REP output from the injection locked oscillator 100a in FIG. 2.

Figure 4:
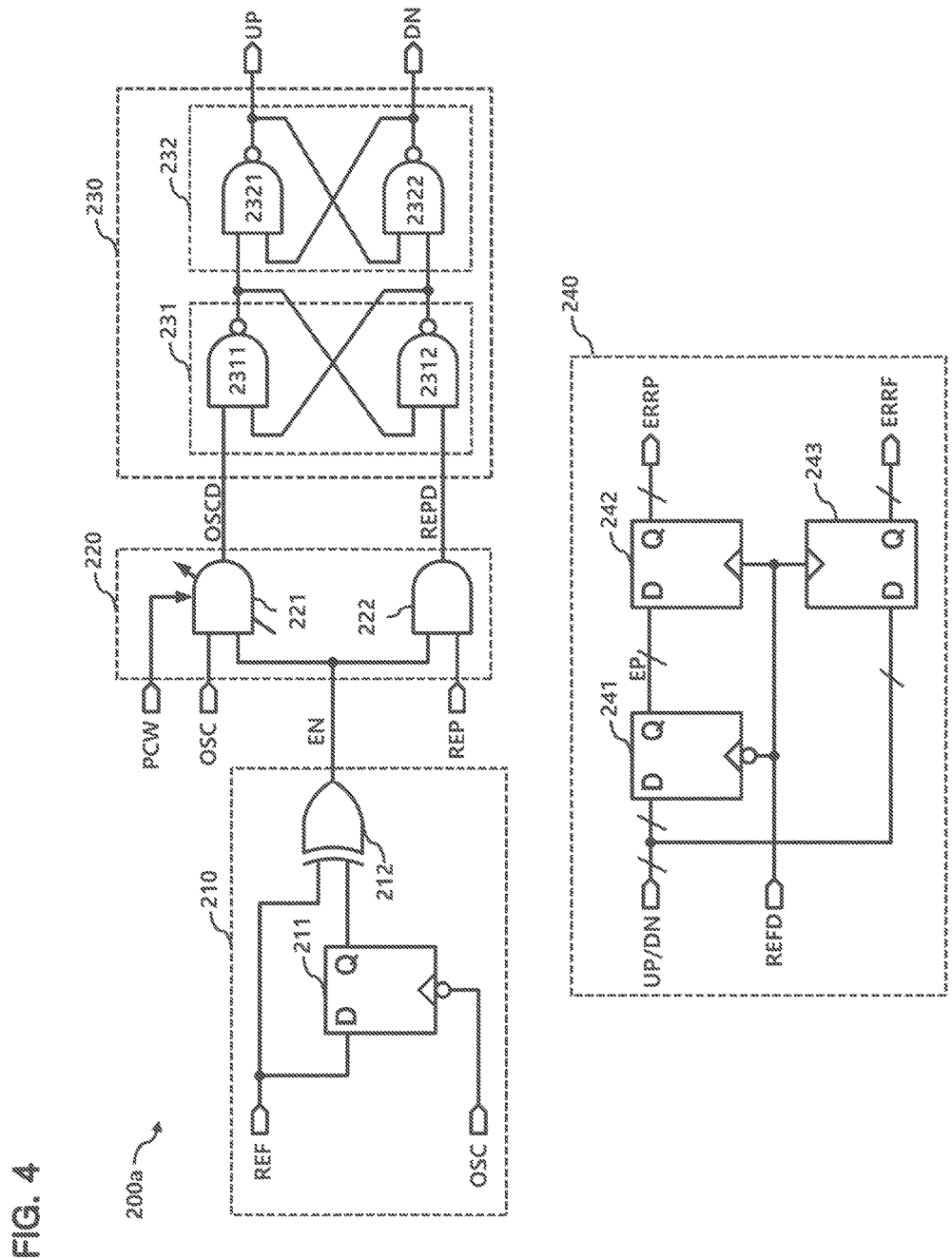
FIG. 4 illustrates an error detector according to an embodiment of the present disclosure.

FIG. 4 illustrates an error detector 200a according to an embodiment of the present disclosure. The error detector 200a of FIG. 4 may be used as the error detector 200 of FIG. 1.

The error detector 200a includes an activation control circuit 210, a signal delay circuit 220, a signal comparison circuit 230, and a signal output circuit 240.

The activation control circuit 210 controls an error detection operation. In an embodiment, the activation control circuit 210 activates an activation signal EN in response to an edge of a reference clock signal REF, and then deactivates the activation signal EN in response to an edge (e.g., a falling edge) of the oscillation signal OSC. The activation signal EN has a first logic value (e.g., a logic high value) when it is activated, and has a second logic value (e.g., a logic low value) when it is deactivated.

The activation control circuit 210 includes a flip-flop 211 latching a value of the reference clock signal REF in synchronization with the falling edge of the oscillation signal OSC. The activation control circuit 210 further includes an XOR gate 212 generating the activation signal EN by performing a logical XOR operation on the reference clock signal REF and an output signal of the flip-flop 211.

The signal delay circuit 220 includes a variable delay circuit 221, which delays the oscillation signal OSC by a variable delay amount according to the phase control signal PCW, and outputs a delayed oscillation signal OSCD.

The signal delay circuit 220 may further include a fixed delay circuit 222, which delays the replica signal REP by a given delay amount (or a fixed delay amount) and outputs a delayed replica signal REPD. In an embodiment, the given delay amount is a predetermined delay amount.

The variable delay circuit 221 variably delays the oscillation signal OSC when the activation signal EN is activated. The fixed delay circuit 222 delays the replica signal REP by a predetermined delay amount when the activation signal EN is activated.

A difference between the variable delay amount of the variable delay circuit 221 and the fixed delay amount of the fixed delay circuit 222 at the beginning of the operation represents a mismatch in paths where the oscillation signal OSC and the replica signal REP are applied. For example, the mismatch in paths includes a device mismatch between a pair of oscillation circuits (e.g., the second oscillation circuit 112 and the replica circuit 130 of FIG. 2) as well as a routing path mismatch between the oscillation signal OSC and the replica signal REP. The routing path mismatch may result from different load capacitances and routing distances from an injection locked oscillator (e.g., the injection locked oscillator 100 of FIG. 1) to an error detector (e.g., the error detector 200 of FIG. 1).

The variable delay amount of the variable delay circuit 221 may be adjusted using the phase control signal PCW to eliminate the mismatch.

The signal comparison circuit 230 compares a phase of the delayed oscillation signal OSCD and a phase the delayed replica signal REPD, and outputs a comparison signal. The comparison signal includes a first comparison signal DN and a second comparison signal UP.

The signal comparison circuit 230 includes a first latch 231 and a second latch 232, which are connected in series.

The first latch 231 includes cross-coupled logic gates (e.g., NAND gates) 2311 and 2312 and the second latch includes cross-coupled logic gates (e.g., NAND gates) 2321 and 2322.

When the delayed oscillation signal OSCD has a logic high value and the delayed replica signal REFD has a logic low value, the first comparison signal DN has a logic low value and the second comparison signal UP has a logic high value. When the delayed oscillation signal OSCD has a logic low value and the delayed replica signal REFD has a logic high value, the first comparison signal DN has a logic high value and the second comparison signal UP has a logic low value.

When both of the delayed oscillation signal OSCD and the delayed replica signal REFD have a logic low value or a logic high value, the first comparison signal DN and the second comparison signal UP hold respective logic states.

The signal output circuit 240 includes a first flip-flop 241 latching values of the first and second comparison signals UP and DN at a falling edge of a delayed reference clock signal REFD. The signal output circuit 240 further includes a second flip-flop 242 latching values of an output signal EP from the first flip-flop 241 at a rising edge of the delayed reference clock signal REFD, and a third flip-flop 243 latching values of the first and second comparison signals UP and DN at the rising edge of the delayed reference clock signal REFD.

The second flip-flop 242 outputs a phase error signal ERRP (e.g., the phase error signal ERRP of FIG. 1), and the third flip-flop 243 outputs a frequency error signal ERRF (e.g., the frequency error signal ERRF of FIG. 1).

In the embodiment of FIG. 4, the phase error signal ERRP indicates a first comparison result of the delayed oscillation signal OSCD and the delayed replica signal REPD when the injection signal INJ is deactivated.

The phase controller 400 of FIG. 1 generates the phase control signal PCW provided to the variable delay circuit 221 in response to the first comparison result.

In the embodiment of FIG. 4, a phase control operation using the phase control signal PCW causes the phase of the delayed oscillation signal OSCD and the phase of the delayed replica signal REPD to align with each other. This indicates that the path mismatch in the feedback control loop, between the oscillation signal OSC and the replica signal REP, is substantially canceled out by adjusting the delay amount of the variable delay circuit 221. When the path mismatch is substantially canceled out, an output offset of the signal comparison unit 230, which functions as a phase detector, becomes substantially equal to zero. As a result, a frequency error of an injection locked phase locked loop (e.g., the injection locked phase locked loop 10 of FIG. 1) that includes the phase detector 200a can be minimized, leading to reduced spur components.

In the embodiment of FIG. 4, the frequency error signal ERRF indicates a second comparison result of the delayed oscillation signal OSCD and the delayed replica signal REPD when the injection signal INJ is activated.

The frequency controller 300 of FIG. 1 generates the frequency control signal FCW applied to the injection locked oscillator 100 of FIG. 1 in response to the second comparison result.

In the embodiment of FIG. 4, a frequency control operation using the frequency control signal FCW causes the frequency of the oscillation signal OSC to become substantially equal to a product equal to a division ratio N times the frequency of the reference clock signal REF.

Figure 5:
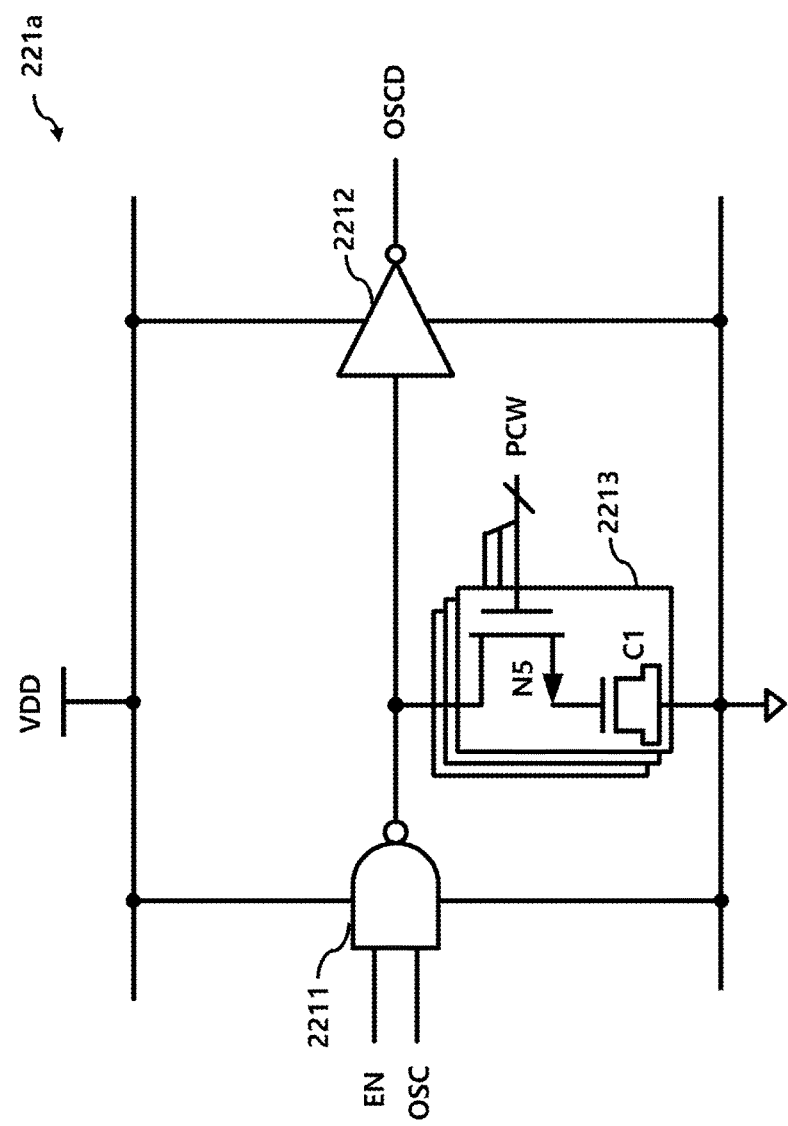
FIG. 5 illustrates a variable delay circuit according to an embodiment of the present disclosure.

FIG. 5 illustrates a variable delay circuit 221a according to an embodiment of the present disclosure. The variable delay circuit 221a of FIG. 5 may be used as the variable delay circuit 221 of FIG. 4.

The variable delay circuit 221a includes a logic gate (e.g., a NAND gate) 2211 and an inverter 2212, which inverts a signal output from the NAND gate 2211.

The NAND gate 2211 receives an activation signal EN and an oscillation signal OSC and performs a logical NAND operation on the activation signal EN and the oscillation signal OSC.

When the activation signal EN has a first logic value (e.g., a logic low value) and the output signal of the NAND gate 2211 has a second logic value (e.g., a logic high value)., the inverter 2212 generates a delayed oscillation signal OSCD having a first logic value (e.g., a logic low value), regardless of a logic value of the oscillation signal OSC.

A capacitance adjusting circuit 2213 is connected between an input terminal of the inverter 2212 and ground.

The capacitance adjusting circuit 2213 may include a plurality of circuits corresponding to a number of bits of the phase control signal PCW. The plurality of circuits of the capacitance adjusting circuit 2213 may be connected in parallel with each other. In an embodiment, each of the plurality of circuits includes a switching element (e.g., an NMOS transistor N5) and a capacitor (e.g., a capacitor C1). The NMOS transistor N5 has first and second conductive terminals (e.g., drain and source) that are connected to an output terminal of the NAND gate 2211 and the capacitor C1, respectively. The NMOS transistor N5 further has a control terminal (e.g., a gate) that receives a corresponding one of a plurality of signals respectively indicating the bits of the phase control signal PCW. The capacitor C1 has first and second ends connected to the second conductive terminal and the ground, respectively.

Accordingly, an amount of delay of the variable delay circuit 221 can vary according to a value of the phase control signal PCW.

Figure 6:
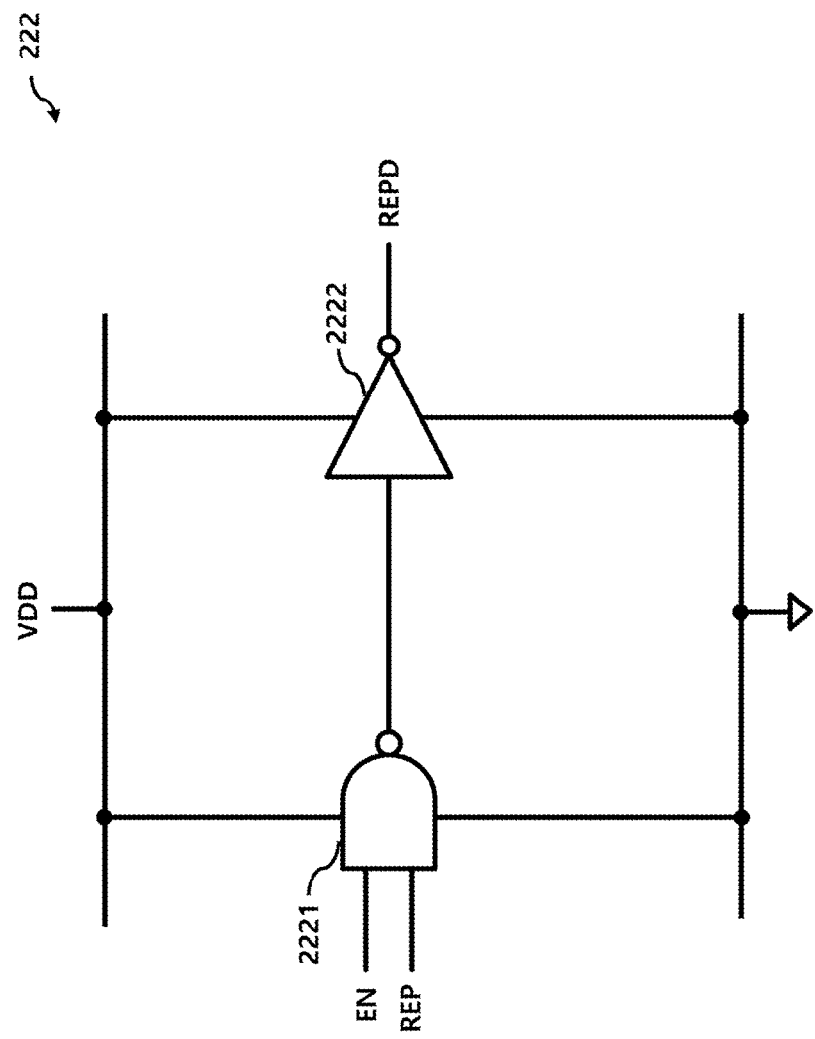
FIG. 6 illustrates a fixed delay circuit according to an embodiment of the present disclosure.

FIG. 6 illustrates a fixed delay circuit 222a according to an embodiment of the present disclosure. The fixed delay circuit 222a of FIG. 6 may be used as the fixed delay circuit 222 of FIG. 5.

The fixed delay circuit 222a includes a logic gate (e.g., an NAND gate) 2221 and an inverter 2222, which inverts a signal output from the NAND gate 2221.

The NAND gate 2221 receives an activation signal EN and a replication signal REP, and performs a logical NAND operation on the activation signal EN and the replication signal REP.

Accordingly, when the activation signal EN has a first logic value (e.g., a logic low value), the NAND gate 2221 generates an output signal having a second logic value (e.g., a logic high value). As a result, the inverter 2222 generates the first logic value (e.g., a logic low value) regardless of a logic value of the replica signal REP.

Figure 7:
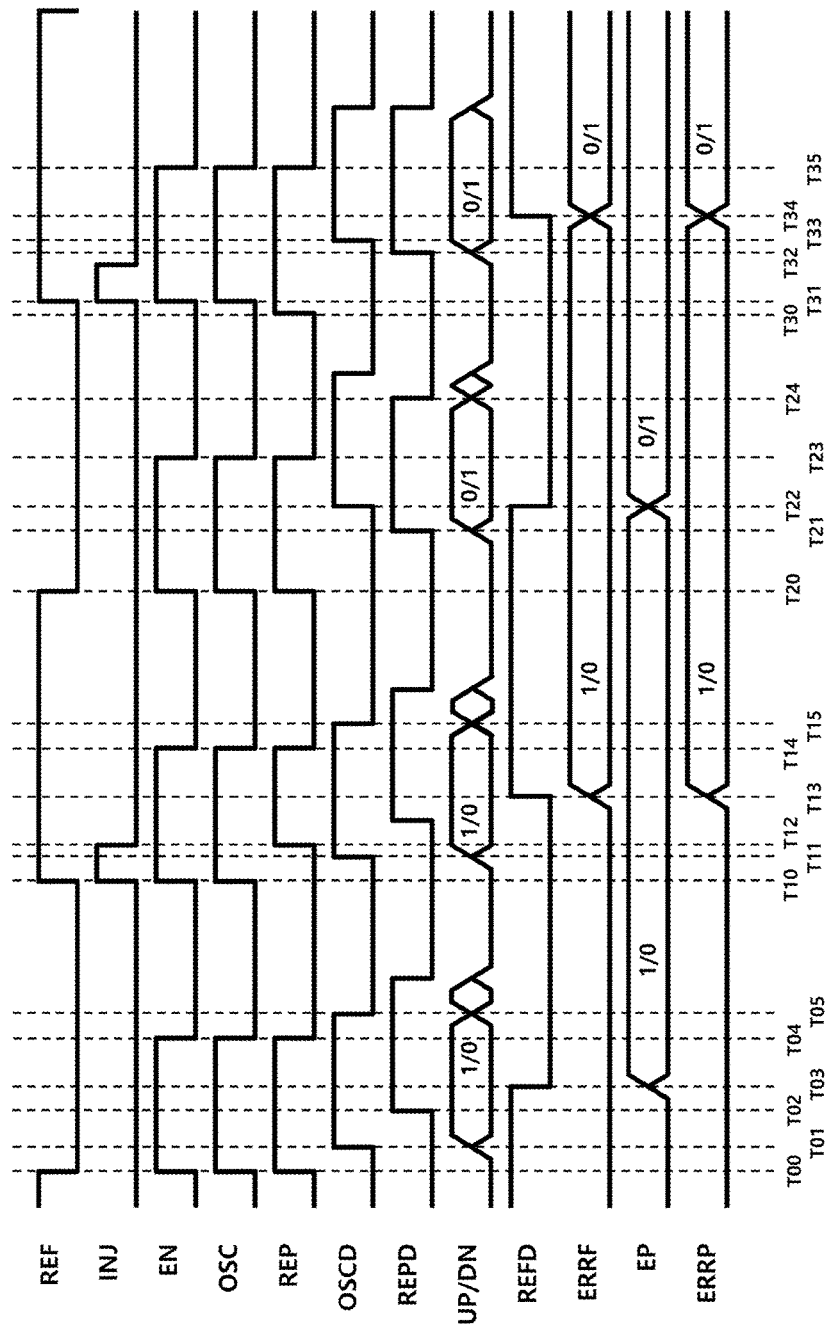
FIG. 7 is a timing diagram illustrating an error detection operation according to an embodiment of the present disclosure.

FIG. 7 is a timing diagram illustrating an error detection operation of an error detector according to an embodiment of the present disclosure. The error detector may be, e.g., the error detector 200a of FIG. 4.

At a first time T00, the reference clock signal REF transitions to a first logic value (e.g., a logic low value), and the oscillation signal OSC and the replica signal REP transition to a second logic value (e.g., a logic high value).

At this time, the injection signal INJ maintains a logic low value.

Since the oscillation signal OSC oscillates at a higher frequency than the reference clock signal REF, the output signal generated by the flip-flop 211 of FIG. 4 has a logic high value before the first time T00. Because the reference clock signal REF transitions from a logic high value to a logic low value at the first time T00, the XOR gate 212 of FIG. 4 generates an activation signal EN transitioning to a logic high value at the first time T00.

The variable delay circuit 221 of FIG. 4 generates the delayed oscillation signal OSCD by delaying the oscillation signal OSC when the activation signal EN has a logic high value. As a result, at a second time T01, the oscillation signal OSCD transitions from a logic low value to a logic high value.

The fixed delay circuit 222 of FIG. 4 generates the delayed replica signal REPD by delaying the replica signal REP when the activation signal EN has a logic high value. As a result, at a third time T02, the delayed replica signal REPD transitions from a logic low value to a logic high value.

The signal comparator 230 of FIG. 4 compares the delayed oscillation signal OSCD with the delayed replica signal REPD.

At the second time T01, because the delayed oscillation signal OSCD has a logic high value and the delayed replica signal REPD has a logic low value, the first comparison signal UP and the second comparison signals DN transition to a logic high value and a logic low value, respectively. In FIG. 7, the reference numeral "1" indicates the logic high value and the reference numeral "0" indicates the logic low value.

At the third time T02, the delayed oscillation signal OSCD has a logic high value and the delayed replica signal REPD has a logic high value, and thus the first and second comparison signals UP and DN maintain the logic high value and the logic low value, respectively.

At a fourth time T03, the delayed reference clock signal REFD transitions from a logic high value to a low value. Accordingly, the first flip-flop 241 of FIG. 4 latches values of the first and second comparison signals UP and DN, which have the logic high value and the logic low value, respectively. The first flip-flop 241 further outputs the signal EP indicating the latched values.

At a fifth time T04, the oscillation signal OSC transitions from the logic high value to the logic low value. Accordingly, the output signal generated by the flip-flop 211 transitions to a logic low value, and thus the activation signal EN generated by the XOR gate 212 transitions to a logic low value.

At a sixth time T05, the delayed oscillation signal OSCD transitions from the logic high value to the logic low value. At the sixth time T05, the signal comparison circuit 230 of FIG. 4 changes the values of the first and second comparison signals UP and DN to logic low and high values, respectively. On the other hand, because the changed values of the comparison signals UP and DN are latched at a time when the delay reference clock signal REFD transitions, the first, second, and third flip-flops 241, 242, and 243 of FIG. 4 do not change the logic values of the signals EP, ERRP, and ERRF at the sixth time T05.

The delayed reference clock signal REFD is obtained by delaying the reference clock signal REF by a given time. In an embodiment, the given time is a predetermined time. For example, the predetermined time may be determined such that a falling edge of the delayed reference clock signal REFD may occur between a first time (e.g., the second time T01 or the third time T02 of FIG. 7), at which one of the delayed oscillation signal OSCD or the delayed replica signal REPD transitions to a logic high value, and a second time (e.g., the sixth time T05 of FIG. 6), at which one of the delayed oscillation signal OSCD or the delayed replica signal REPD transitions to a logic low value.

At a seventh time T10, the reference clock signal REF transitions to a logic high value and the oscillation signal OSC transitions to a logic high value.

When the reference clock signal REF transitions to the logic high value, an injection signal generator (e.g., the injection signal generator 500 of FIG. 1) generates an injection signal INJ having a positive pulse.

Referring back to FIG. 2, the ILO 100a generates the replica signal REP by replicating the oscillation signal OSC when the injection signal INJ is deactivated. As a result, the oscillation signal OSC has a phase substantially the same as a phase of the replication signal REP when the injection signal INJ is deactivated. In contrast, when the injection signal INJ is activated, a phase difference between the oscillation signal OSC and the replication signal REP may occur.

The phase difference between the oscillation signal OSC and the replica signal REP may relate to a frequency variation of the ILO 100a. The frequency variation results from, for example, a process-voltage-temperature (PVT) variation.

At the seventh time T10, because the reference clock signal REF transitions to a logic high value and the flip-flop 211 of FIG. 4 keeps generating the output signal having a logic low value, the activation signal EN generated by the XOR gate 212 of FIG. 4 transitions to a logic high value.

The variable delay circuit 221 of FIG. 4 generates the oscillation signal OSCD by delaying the oscillation signal OSC when the activation signal EN has a logic high value. As a result, at an eighth time T11, the oscillation signal OSCD transitions from a logic low value to a logic high value.

The replica signal REP transitions to a logic high value at a ninth time T12. The fixed delay circuit 222 of FIG. 4 generates the delayed replica signal REPD by delaying the replica signal REP. The delayed replica signal REPD transitions to a logic high value between the ninth time T12 and a tenth time T13.

The signal comparison circuit 230 of FIG. 4 compares the delayed oscillation signal OSCD with the delayed replica signal REPD.

At the eighth time T11, because the delayed oscillation signal OSCD has a logic high value and the delayed replica signal REPD has a logic low value, the first comparison signal UP and the second comparison signals DN transition to a logic high value and a logic low value, respectively.

At the tenth time T13, the delayed reference clock signal REFD transitions to a logic high value.

Accordingly, the second flip-flop 242 of FIG. 4 latches values of the output signal EP of the first flip-flop 241 of FIG. 4 and outputs the phase error signal ERRP, which indicates the latched values of the output signal EP. The third flip-flop 243 of FIG. 4 latches values of the comparison signals UP and DN, which are logic high and logic low values, respectively, and outputs the frequency error signal ERRF, which indicates the latched values of the comparison signals UP and DN.

At an eleventh time T14, the oscillation signal OSC transitions to a logic low value. Accordingly, the output signal generated by the flip-flop 211 of FIG. 4 has a logic high value and the activation signal EN transitions to a logic low value.

At a twelfth time T15, the delayed oscillation signal OSCD transitions to a logic low value.

At the twelfth time T15, the first and second comparison signals UP and DN transition to a logic low value and a logic high value, respectively. On the other hand, because the comparison signals UP and DN are latched at a time when the delay reference clock signal REFD transitions, the logic values of the signals EP, ERRP, and ERRF respectively output from the first, second, and third flip-flops 241, 242, and 243 of FIG. 4 remain unaffected.

At a thirteenth time T20, the reference clock signal REF transitions to a logic low value, and the oscillation signal OSC and the replica signal REP transition to respective logic high values.

At the thirteenth time T20, the injection signal INJ maintains the logic low value.

Because the oscillation signal OSC oscillates at a faster frequency than the reference clock signal REF, the output signal generated by the flip-flop 211 of FIG. 4 has a logic high value immediately before the thirteenth time T20.

At the thirteenth time T20, because the reference clock signal REF transitions to a logic low value, the activation signal EN generated by the XOR gate 212 of FIG. 4 transitions to a logic high value.

At a fourteenth time T21, the delayed replica signal REPD generated by the fixed delay circuit 222 transitions to a logic high value.

At a fifteenth time T22, the delayed oscillation signal OSCD generated by the variable delay circuit 221 of FIG. 4 transitions to a logic high value.

The delay amount of the variable delay unit 221 is adjusted according to the phase control signal PCW. For example, a phase controller (e.g., the phase controller 400 of FIG. 1) generates the phase control signal PCW that has an adjusted value according to the phase error signal ERRP that has the value at the tenth time T13.

The signal comparison circuit 230 of FIG. 4 compares the delayed oscillation signal OSCD with the delayed replica signal REPD.

At the fourteenth time T21, because the delayed oscillation signal OSCD has a logic low value and the delayed replica signal REPD has a logic high value, the comparison signals UP and DN transition to a logic low value and a logic high value, respectively.

At the fifteenth time T22, because the delayed oscillation signal OSCD has a logic high value and the delayed replica signal REPD also has a logic high value, the comparison signals UP and DN maintain logic low and high values, respectively.

The delayed reference clock signal REFD transitions to the logic low value at the fifteenth time T22.

Accordingly, the first flip-flop 241 latches the first and second comparison signals UP and DN, which have logic low and high values, respectively, and outputs the signal EP indicating the latched values.

At a sixteenth time T23, the oscillation signal OSC transitions to a logic low value. Accordingly, the output signal generated by the flip-flop 211 of FIG. 4 transitions to a logic low value, and the activation signal EN generated by the XOR gate 212 of FIG. 4 transitions to a logic low value.

At a seventeenth time T24, the delayed replica signal REPD transitions to a low value.

At the seventeenth time T24, the comparison signals UP and DN transition to logic high and low values, respectively. On the other hand, because the transitioned values of the comparison signals UP and DN are latched at a time when the delay reference clock signal REFD transitions, the logic values of the signals EP, ERRP, and ERRF respectively output from the first, second, and third flip-flops 241, 242, and 243 of FIG. 4 remain unchanged.

At an eighteenth time T30, the replication signal REP transitions to a logic high value.

At a nineteenth time T31, the reference clock signal REF transitions to a logic high value.

When the reference clock signal REF transitions to the logic high value, the injection signal INJ generated by the injection signal generator (e.g., the injection signal generator 500 of FIG. 1) has a positive pulse.

Referring back to FIG. 2, the ILO 100a generates the replica signal REP by replicating the oscillation signal OSC when the injection signal INJ is deactivated. When the injection signal INJ is activated, a phase difference between the oscillation signal OSC and the replication signal REP may occur.

The phase difference between the oscillation signal OSC and the replication signal REP may also occur when a free running frequency of the ILO 100a varies due to a PVT variation.

In the embodiment of FIG. 7, the replica signal REP transitions to a logic high value at the eighteenth time T30, which is before the oscillation signal OSC transitions to a logic high value at the nineteenth time T31.

Since the oscillation signal OSC oscillates at a faster frequency than the reference clock signal REF, the output signal generated by the flip-flop 211 of FIG. 4 has a logic low value immediately before the eighteenth time T30.

At the nineteenth time T31, because the reference clock signal REF transitions to the high value, the activation signal EN generated by the XOR gate 212 of FIG. 4 transitions to a logic high value.

At a twentieth time T32, the delayed replica signal REPD transitions to a logic high value.

At a twenty-first time T33, the delayed oscillation signal OSCD generated by variable delay circuit 221 of FIG. 4 transitions to a logic high value when the activation signal EN has a logic high value.

The signal comparison circuit 230 of FIG. 4 compares the delayed oscillation signal OSCD with the delayed replica signal REPD.

At the twentieth time T32, because the delayed oscillation signal OSCD has a logic low value and the delayed replica signal REPD has a logic high value, the first and second comparison signals UP and DN transition to a logic low value and a high value, respectively.

At the twenty-first time T33, because the delayed oscillation signal OSCD has a logic high value and the delayed replica signal REPD also has a logic high value, the first and second comparison signals UP and DN maintain the logic low value and the logic high value, respectively.

At a twenty-second time T34, the delayed reference clock signal REFD transitions to a logic high value.

Thus, the second flip-flop 242 of FIG. 4 latches values of the output signal EP of the first flip-flop 241 of FIG. 4, and outputs the phase error signal ERRP indicating the latched values of the output signal EP. The third flip-flop 243 of FIG. 4 latches values of the comparison signals UP and DN, which have a logic low value and a logic high value, respectively, and outputs the frequency error signal ERRF, which indicates the latched values of the comparison signals UP and DN.

At a twenty-third time T35, the oscillation signal OSC transitions to a logic low value. Accordingly, the output signal generated by the flip-flop 211 of FIG. 4 has a logic high value, and the activation signal EN transitions to a logic low value.

Thereafter, because a similar operation is repeated to generate the phase error signal ERRP and the frequency error signal ERRF as described above, further descriptions thereof are omitted herein for the interest of brevity.

Figure 8:
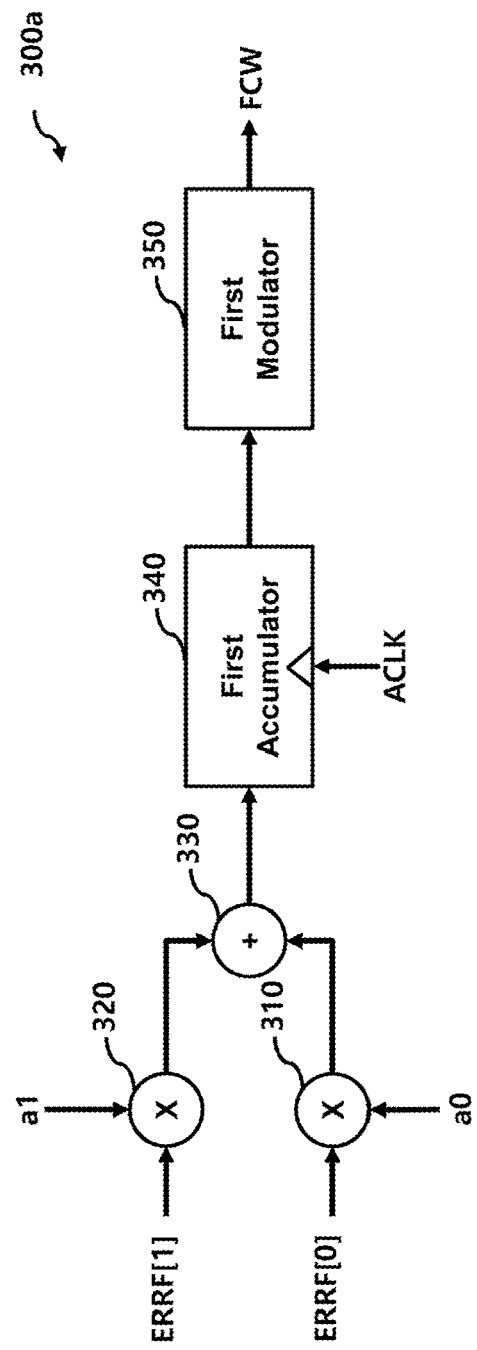
FIG. 8 is a block diagram of a frequency controller according to an embodiment of the present disclosure.

FIG. 8 is a block diagram of a frequency controller 300a according to an embodiment of the present disclosure. The frequency controller 300a of FIG. 8 may be used as the frequency controller 300 of FIG. 1.

The frequency controller 300a includes a first multiplier 310, a second multiplier 320, a first adder 330, a first accumulator 340, and a first modulator 350.

The first multiplier 310 multiplies a value of a first frequency error signal ERRF[0] corresponding to the first comparison signal DN by a first coefficient a0, and generates a first output signal indicating the multiplied value.

The second multiplier 320 multiplies a value of a second frequency error signal ERRF[1] corresponding to the second comparison signal UP by a second coefficient a1, and generates a second output signal indicating the multiplied value.

The first coefficient a0 and the second coefficient a1 may have opposite signs, and respective magnitudes of the first and second coefficients a0 and a1 can vary according to embodiments.

The first adder 330 generates a third output signal by adding the value of the first output signal of the first multiplier 310 and the value of the second output signal the second multiplier 320.

The first accumulator 340 generates a fourth output signal by accumulating values of the third output signal of the first adder 330 in response to an edge (e.g., a rising edge) of a sampling clock signal.

In an embodiment, the sampling clock signal ACLK can be generated by delaying the delayed reference clock signal REFD by a predetermined time. For example, the predetermined time can be set according to a time interval during which the first multiplier 310, the second multiplier 320, and the first adder 330 generate respective output signals in response to the first and second frequency error signals ERRF [0] and ERRF [1] output from the third flip-flop 243 of FIG. 4.

The first modulator 350 modulates the fourth output signal of the first accumulator 340 and generates the frequency control signal FCW. In an embodiment, the first modulator 350 may be implemented with a delta sigma modulator wherein the delta sigma modulator 350 may generate the frequency control signal FCW by dithering the fourth output signal of the first accumulator 340.

Figure 9:
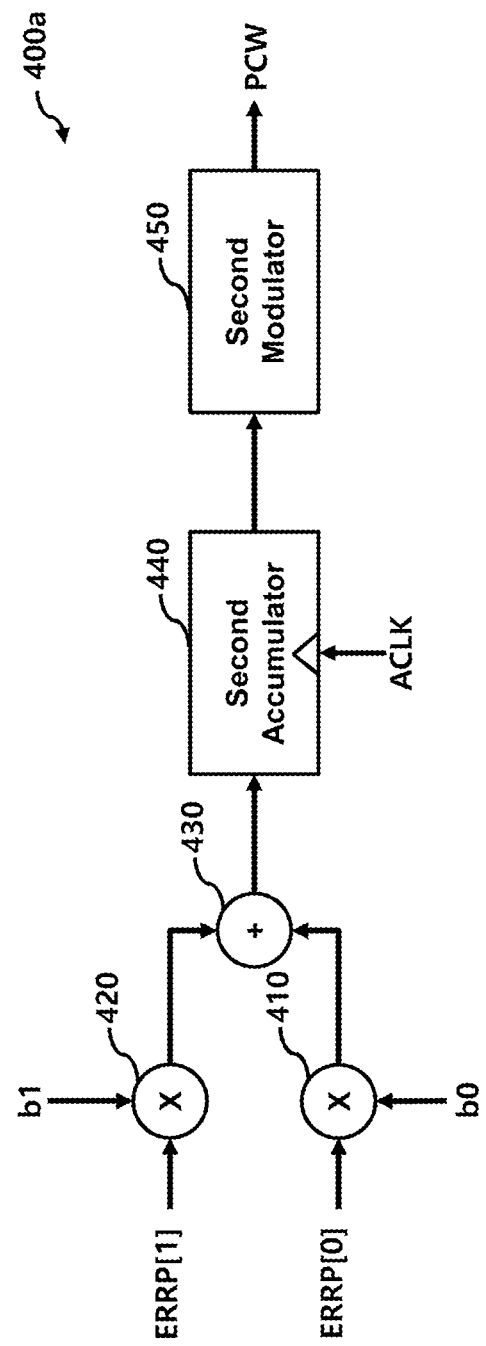
FIG. 9 is a block diagram of a phase controller according to an embodiment of the present disclosure.

FIG. 9 is a block diagram of a phase controller 400a according to an embodiment of the present disclosure. The phase controller 400a of FIG. 9 may be used as the phase controller 400 of FIG. 1.

The phase controller 400a includes a third multiplier 410, a fourth multiplier 420, a second adder 430, a second accumulator 440, and a second modulator 450.

The third multiplier 410 multiplies a value of a first phase error signal ERRP[0] corresponding to the first comparison signal DN by a third coefficient b0, and generates a first output signal indicating the multiplied value.

The fourth multiplier 420 multiplies a value of the second phase error signal ERRP[1] corresponding to the second comparison signal UP by a fourth coefficient b1, and generates a second output signal indicating the multiplied value.

The third coefficient b0 and the fourth coefficient b1 may have opposite signs, and respective magnitudes of the third and fourth coefficients b0 and b1 may vary according to embodiments.

The second adder 430 generates a third output signal by adding the value of the first output signal of the third multiplier 410 and the value of the second output signal of the fourth multiplier 420.

The second accumulator 440 generates a fourth output signal by accumulating values of the third output signal of the second adder 430 in response to an edge (e.g., a rising edge) of the sampling clock signal ACLK.

In an embodiment, the sampling clock signal ACLK can be generated by delaying the delayed reference clock signal REFD by a predetermined time. For example, the predetermined time may be set according to a time interval during which the third multiplier 410, the fourth multiplier 420, and the second adder 430 generate respective output signals in response to the first and second phase error signals ERRP[0] and ERRP[1], which are output from the second flip-flop 242.

The second modulator 450 modulates the fourth output signal of the second accumulator 440 and generates the phase control signal PCW. In an embodiment, the second modulator 450 may be implemented with a delta sigma modulator wherein the delta sigma modulator 450 may generate the phase control signal PCW by dithering the fourth output signal of the second accumulator 440.

As described above with reference to FIGS. 8 and 9, the first accumulator 340 and the second accumulator 440 may update respective cumulative values in response to the same edge of the sampling clock signal ACLK. Thus, a value of the phase control signal PCW and a value of the frequency control signal FCW can be changed substantially at the same time.

However, embodiments of the present disclosure are not limited thereto. For example, the first accumulator 340 and the second accumulator 440 may updated the respective cumulative values at different times.

Figure 10:
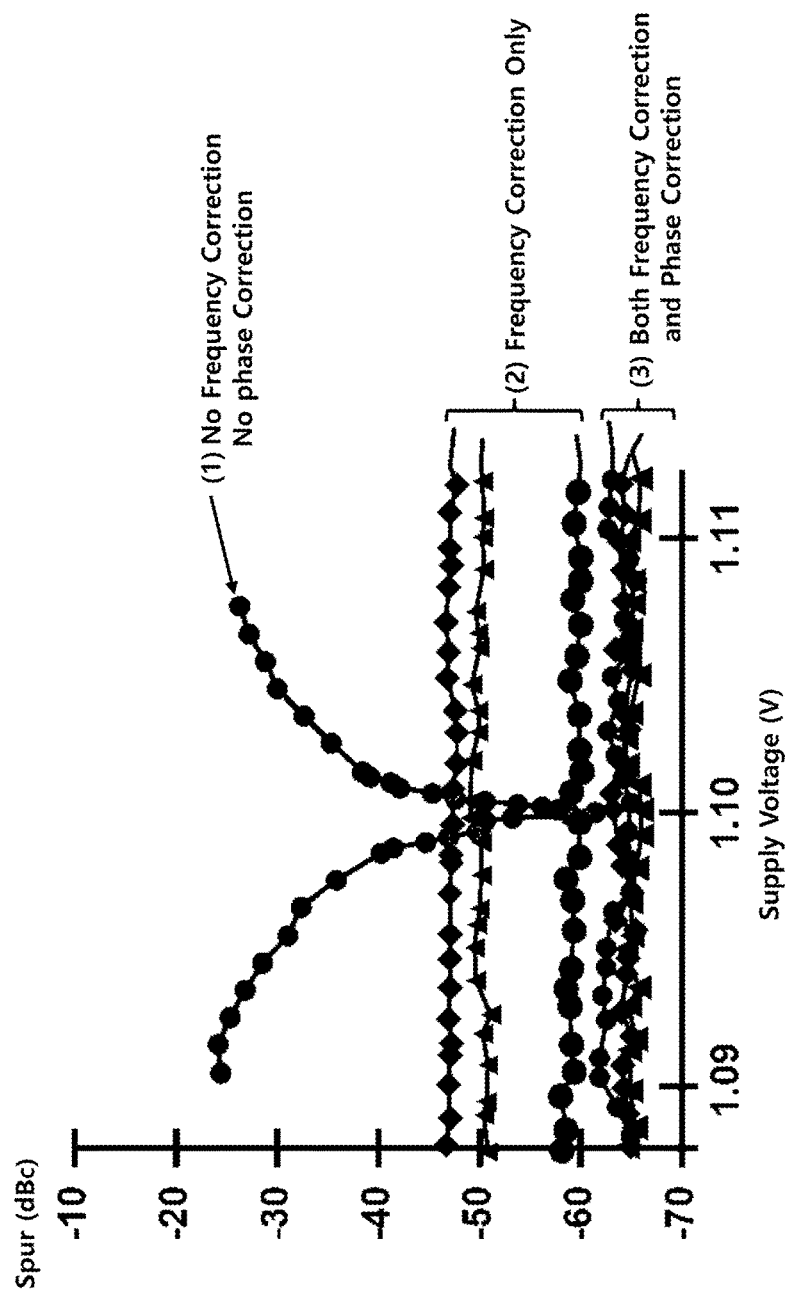
FIG. 10 illustrates the spur reduction capability of an injection locked phase locked loop according to an embodiment of the present disclosure.

FIG. 10 illustrates the spur reduction capability of an injection locked phase locked loop according to an embodiment of the present disclosure. FIG. 10 may illustrate, for example, the spur reduction capability of the injection locked phase locked loop 10 of FIG. 1. FIG. 10 shows magnitudes (e.g., powers) of spurs in decibels relative to the carrier (dBc) as a function of supply voltages proximate to a normal voltage (e.g., 1.1V).

In FIG. 10, a first graph (1) may indicate magnitudes of spurs of a first injection locked phase locked loop including the injection locked oscillator 100 in FIG. 1, when the injection locked oscillator 100 is not connected to structures performing a frequency correction operation and a phase correction operation. The magnitudes of spurs increase sharply when the supply voltage deviates from the normal voltage (e.g., 1.1V) after performing an injection locking operation.

A second graph (2) indicates magnitudes of spurs of a second injection locked phase locked loop including the injection locked oscillator 100 and the frequency controller 300 in FIG. 1, which performs the frequency correction operation. The second graph (2) shows experimental results for a plurality of samples.

When only the frequency correction is performed, a control operation using the frequency control signal FCW is performed without performing a control operation using the phase control signal PCW.

A third graph (3) indicates magnitudes of spurs of a third injection locked phase locked loop including the injection locked oscillator 100, the frequency controller 300, and the phase controller 400 in FIG. 1, which together perform the frequency correction operation and the phase correction operation. The third graph (3) shows experimental results for a plurality of samples.

As shown in the graph (2), when only the frequency correction is performed, the magnitudes of spurs do not vary significantly even if the supply voltage deviates from the normal voltage (e.g., 1.1V). On the other hand, the magnitudes of the spurs are greater than magnitudes of the spurs shown in the first graph (1) when the supply voltage is proximate to the normal voltage (e.g., 1.1V).

When both frequency correction operation and phase correction operation are performed as shown in the third graph (3), the magnitudes of the spurs maintains a substantially constant value and remain at a relatively low level compared to those shown in the first and second graphs (1) and (2), over the entire range of the supply voltage shown in FIG. 10.

Although various embodiments have been described for illustrative purposes, it will be apparent to those skilled in the art that various changes and modifications may be made without departing from the spirit and scope of the invention as defined in the following claims.

What is claimed is:

1. An injection locked phase locked loop comprising:
an injection locked oscillator configured to generate an oscillation signal according to an injection signal and to generate a replica signal by replicating the oscillation signal when the injection signal is deactivated;
a phase controller configured to generate a phase control signal according to a phase error signal; and
an error detector configured to generate the phase error signal by comparing a phase of the oscillation signal and a phase of the replica signal, and to control a phase difference between the oscillation signal and the replica signal according to the phase control signal.

2. The injection locked phase locked loop of claim 1, further comprising an injection signal generator configured to generate the injection signal, the injection signal having a pulse synchronized with a rising edge of a reference clock signal.

3. The injection locked phase locked loop of claim 1, wherein the injection locked oscillator comprises:
a plurality of oscillation circuits each including first and second input terminals and first and second output terminals, the plurality of oscillation circuits including a first oscillation circuit configured to output the oscillation signal at the first output terminal according to the injection signal;
an injection signal input circuit configured to connect the first and second output terminals of the first oscillation circuit; and
a replica circuit configured to generate the replica signal, the replica circuit being connected in parallel to the first oscillation circuit.

4. The injection locked phase locked loop of claim 1, wherein the error detector comprises:
a signal delay circuit configured to generate a delayed oscillation signal and a delayed replica signal according to the phase control signal, the delayed oscillation signal being generated by delaying the oscillation signal by a first delay amount, the delayed replica signal being generated by delaying the replica signal by a second delay amount; and
a signal comparison circuit configured to generate a comparison signal by comparing a phase of the delayed oscillation signal and a phase of the delayed replica signal.

5. The injection locked phase locked loop of claim 4, wherein the signal delay circuit comprises a variable delay circuit configured to delay the oscillation signal by the first delay amount, the first delay amount varying according to the phase control signal.

6. The injection locked phase locked loop of claim 5, wherein the signal delay circuit further comprises a fixed delay circuit configured to delay the replica signal by the second delay amount.

7. The injection locked phase locked loop of claim 4, wherein the error detector further comprises a signal output circuit configured to output the phase error signal by latching the comparison signal.

8. The injection locked phase locked loop of claim 1, further comprising:
a frequency controller configured to generate a frequency control signal according to a frequency error signal, wherein the injection locked oscillator adjusts a frequency of the oscillation signal according to the frequency control signal, and
wherein the error detector compares the phase of the oscillation signal and the phase of the replica signal when the injection signal is activated and generates the frequency error signal.

9. The injection locked phase locked loop of claim 8, wherein the error detector comprises:
a signal delay circuit configured to generate a delayed oscillation signal and a delayed replica signal according to the phase control signal, the delayed oscillation signal being generated by delaying the oscillation signal by a first delay amount, the delayed replica signal being generated by delaying the replica signal by a second delay amount;
a signal comparison circuit configured to generate a comparison signal by comparing a phase of the delayed oscillation signal and a phase of the delayed replica signal; and
a signal output circuit configured to output the phase error signal and the frequency error signal by latching the comparison signal.

10. The injection locked phase locked loop of claim 9, wherein the error detector further comprises an activation control circuit configured to control the signal delay circuit by generating an activation signal in response to the oscillation signal and a reference clock signal.

11. The injection locked phase locked loop of claim 10, wherein the activation signal has a first logic value in response to an edge of the reference clock signal and has a second logic value in response to a falling edge of the oscillation signal.

12. The injection locked phase locked loop of claim 11, wherein the signal delay circuit comprises a variable delay circuit comprising:
a NAND gate performing a logical NAND operation on the activation signal and the oscillation signal;
an inverter inverting an output signal of the NAND gate and generating the delayed oscillation signal; and
a variable delay circuit including a capacitance adjusting circuit, the capacitance adjusting circuit adjusting a capacitance value in response to the phase control signal and being coupled between an output of the NAND gate and a ground.

13. The injection locked phase locked loop of claim 11, wherein the signal delay circuit includes a fixed delay circuit comprising:
a NAND gate performing a logical NAND operation on the activation signal and the replica signal; and
an inverter inverting an output signal of the NAND gate and generating the delayed replica signal.

14. The injection locked phase locked loop of claim 9, wherein the signal output circuit comprises:
a first flip-flop configured to latch the comparison signal in response to an inverted version of a delayed reference clock signal; and
a second flip-flop configured to latch the comparison signal in response to the delayed reference clock signal.

15. The injection locked phase locked loop of claim 14, wherein the signal output circuit further comprises a third flip-flop configured to latch an output signal of the first flip-flop in response to the delayed reference clock signal.

16. The injection locked phase locked loop of claim 15, wherein the third flip-flop latches the output signal of the first flip-flop when the second flip-flop latches the comparison signal in response to a rising edge of the delayed reference clock signal.

17. The injection locked phase locked loop of claim 9, wherein the frequency controller comprises:

an accumulator configured to accumulate values according to a sampling clock signal, each of the values being obtained by performing an arithmetic operation on the frequency error signal with one or more coefficients; and a modulator configured to modulate an output signal of the accumulator and to generate the frequency control signal.

18. The injection locked phase locked loop of claim 9, wherein the phase controller comprises:

an accumulator configured to accumulate values according to a sampling clock signal, each of the values being obtained by performing an arithmetic operation on the phase error signal with one or more coefficients; and a modulator configured to modulate an output signal of the accumulator and to generate the phase control signal.

19. The injection locked phase locked loop of claim 8, further comprising:

a frequency divider configured to generate a divided signal by dividing a frequency of the oscillation signal;

a phase comparator configured to compare a phase of the divided signal and a phase of a reference clock signal; and a path selector configured to select either an output signal of the phase comparator or the frequency error signal, and to provide the selected signal to the frequency controller.

20. The injection locked phase locked loop of claim 19, wherein the path selector selects the output signal of the phase comparator when an initialization completion signal has a first logic value and selects the frequency error signal when the initialization completion signal has a second logic value, the initialization completion signal indicating whether an initial phase locking operation has been completed or not.

* * * * *